United States Patent [19]

Yonehara et al.

[11] 4,362,383

[45] Dec. 7, 1982

[54] METHOD AND AN APPARATUS FOR COLOR COMPENSATION EXPOSURE

[75] Inventors: Hiroyuki Yonehara, Hikone; Yoshikazu Kimura, Kusatsu; Kenjiro Tanabe, Hikone, all of Japan

[73] Assignee: Dainippon Seizo Kabushiki Kaisha, Japan

[21] Appl. No.: 145,522

[22] Filed: May 1, 1980

[30] Foreign Application Priority Data

May 2, 1979 [JP] Japan .................................. 54-53506

[51] Int. Cl.$^3$ .............................................. G03B 27/72
[52] U.S. Cl. .................................................... 355/71
[58] Field of Search ................. 354/202, 288, 202 FF; 355/77, 71, 32, 35, 36, 38, 67, 68

[56] References Cited

U.S. PATENT DOCUMENTS

| | | | |
|---|---|---|---|
| 3,184,307 | 5/1965 | Letzer | 355/38 X |
| 3,521,952 | 7/1970 | Nelson et al. | 355/71 X |
| 3,533,693 | 10/1970 | Balint | 355/71 |
| 3,545,859 | 12/1970 | Schumacher | 355/71 |
| 3,797,933 | 3/1974 | Sable | 355/35 |
| 4,068,943 | 1/1978 | Gyori | 355/77 X |
| 4,150,991 | 4/1979 | Dillow | 355/77 X |

*Primary Examiner*—Donald A. Griffin
*Attorney, Agent, or Firm*—Marvin H. Kleinberg

[57] ABSTRACT

A method and an apparatus for color compensation exposure are disclosed, wherein, a color compensation exposure is performed firstly with white light only, secondly with a primary filter, and thirdly with a secondary filter in combination with the primary filter, and the time periods of these partial exposures are computed according to a certain algorithm from information on the required kind of color compensation expressed in terms of partial indices of color compensation filters.

3 Claims, 2 Drawing Figures

METHOD AND AN APPARATUS FOR COLOR COMPENSATION EXPOSURE

BACKGROUND OF THE INVENTION

This invention relates to a method of color compensation exposure, and in particular, to a method of color exposure control for use in reproducing a positive photographic color picture from a positive color picture for printing purposes (referred to as color duplication hereinafter).

So-called color reproduction generally includes (1) electronic photographic reproduction, (2) reproduction of a positive image on color photographic paper from a negative photographic negative film (color printing), and (3) reproduction of a positive color image on a photosensitive duplicating film from a positive original picture (color duplication). Among such a variety of color reproduction, the last mentioned color duplication is the one which requires the highest level of color reproduction and is commonly used as an original picture for direct use in printing purposes.

In the field of color reproduction in general, the techniques for compensating color failure, which is a typical problem encountered in color printing, have been well known. However, in the field of color duplication, color failure of duplicating film rarely causes any problem but the problem of imperfection (bias in color tone) of the positive color original picture has been considered as a major problem which has to be compensated for somehow.

In most cases such color compensations are made with the use of color compensating filters. They are commercially available with indices ranging from 0 to 50 in multiples of 5 for each of the three basic colors cyan, magenta and yellow. Normally, two filters of two colors out of the three basic colors with suitable indices are used in combination for attaining a desired result from color compensation.

Therefore, when conducting a color compensating exposure for printing or duplication, it is necessary to select two filters out of a number of filters for effecting a desired color compensation after finding the colors for which a compensation is required and the required indices of the filters.

Such work is often very time consuming and skilled personnel is required for conducting such work. In particular, when producing so-called composite multi-color pictures in which a plurality of multi-color original pictures are arranged or laid out according to a plan on a single sheet of photosensitive film, the work involved becomes very time consuming since each original color picture generally has different color tones from the other pictures to be laid out together. No mistake is allowed in such work since one failure in color compensation in one original picture will ruin the whole composite color picture.

In the field of color the following methods for color compensation exposure have been either practiced or proposed.

The most basic method is the one in which a required kind of color compensation is first determined by visual inspection through a color viewer (using standard illuminating light) and, in addition to selecting the required colors of color compensating filters, their indices are selected.

Such a required kind of color compensation is usually expressed in terms of colors of filters and their indices such as 35C+25Y, 15M+20Y, etc. where the alphabetic terms indicate the color of filters, cyan C, magenta M, or yellow Y, and the numbers placed before them indicate their respective densities.

The selected color compensating filters are placed over the light source or at an appropriate location along the optical center line connecting the light source and a photosensitive material for an appropriate time period.

This method is very basic and simple in concept, but, since a great number of filters must be prepared in advance for effecting a wide range of color compensation, i.e. 10 filters for each of the three basic colors, at least, this method is rather complicated for an unskilled worker, and is not suitable for automatization either.

Another available method is the one using an integrating sphere. According to this method, each one of three color compensating filters having relatively high incides of the three basic colors, respectively, is independently thrust into the light path from a light source to an integrating sphere which is designed to accomplish a color mixture. A desired kind of color compensation is accomplished by selectively moving each of the three color compensating filters into the light path.

In this case, if the desired color compensation is of a kind which may be accomplished using only one color compensating filter, it may be easily done simply by adjusting the exposure interval of the particular color compensating filter according to the reading of a dial or the like. However, when more than one color compensating filter is required for accomplishing the desired color compensation, it is very difficult to obtain a desired quality of color compensation exposure since the two color compensating filters will influence one another in a very complicated manner. Accordingly, some skill, which may be acquired only through much experience, will be required when putting this method into practice.

There is yet another possible method, which may be called a method of partial exposure times, according to which three, color compensating filters having relatively high indices of the three basic colors (50C, 50M and 50Y, for example), respectively, are prepared in advance, and the exposure is first made with only white light followed by additional exposures with one or two color compensating filters used in succession, either over the light source or at an appropriate location along the light path.

According to this method, the required kind of color compensation needs to be expressed in terms of allocation of total exposure time to each of the exposures (partial exposures), i.e. the exposure with only the white light and the additional exposures with one or two filters placed in the light path.

However, according to this method, a desired color compensation needs to be expressed in total exposure time and ratios between the allocated partial exposure times as opposed to the normal procedure in conventional color compensation exposures. There a desired color compensation is expressed in terms of colors and indices of color compensating filters which will produce the desired color compensating effect in such forms as 35C+25Y, 15M+20Y, etc. In the art of color compensation exposure, it has been the general practice to specify a desired color compensation in terms of a combination of indices of two color compensating filters which will produce a best result. Therefore, in order to make use of the method of partial exposure times, it becomes necessary to convert the indices of two color compensating filters into partial exposure times which will produce an identical color compensating effect.

Such a conversion has been generally believed to be impossible. In fact, in the method of partial exposure times, since the light from the light source will be attenuated by the color compensating filters due to their indices, which have certain spectral distributions, in a complicated manner, there has been no available method for determining the total exposure time nor the ratios between the partial exposure times. If, for example, the total exposure time is selected as the one which will produce a best result with the white light alone and it is allocated to the partial exposure times, not only does the overall exposure tend to be too little, but also it is very doubtful that a proper quality of color compensation will be attained. Therefore with this proposed method of partial exposure times, a skill which may be acquired only through much experience will become necessary.

However, according to this proposed method of partial exposure times, it is relatively easy to automatize a color compensation exposure, once the total exposure time and the ratios of the partial exposure times are known.

In consideration of the above described shortcomings of the conventional or proposed methods, one of the primary objects of this invention is to provide a method for color compensation exposure for color duplicators or the like which allows a desired kind of color compensation, which is defined in terms of a combination of filters with respect to their colors and indices, to be made according to an improved method of color compensation exposure based on a method of partial exposure times which is accurate in color compensation and easy to be automatized.

Such object is accomplished, according to this invention, by providing an improved method of partial exposure times comprising the steps of preparing three, color compensating filters having relatively high densities, respectively, selecting a primary color compensating filter out of the three, the color of which requires the greatest amount of color compensation, selecting a secondary color compensating filter, the color of which requires a secondary amount of color compensation, converting the densities of the two color compensating fiters with which the desired color compensation is defined into partial exposure times, comprising a first partial exposure time during which only white light is to be used for exposure, a second partial exposure time during which the primary color compensating filter is to be used over the white light, and a third partial exposure time during which the secondary color compensation filter is to be used over the white light in combination with the primary color compensating filter. An exposure made in three partial exposure times, each with a corresponding use of a color compensating filter or two, has the same effect as an exposure which is made with a use of two color compensating filters having two colors of appropriate indices, with which the desired color compensation is defined. The result is accomplished by an optimization of total effective exposure at a plurality of wave lengths selected from the visible range of light, and conducting three partial exposures in an arbitrary order, a first partial exposure only with the white light during the first partial exposure time, a second partial exposure with the primary color compensating filter placed over the white light during the second partial exposure time, and a third partial exposure with the secondary color compensating filter placed over the white light in combination with the primary color compensating filter.

This method is conveniently carried out with an apparatus according to this invention which comprises a film holder for holding a photosensitive material, a light source of a known spectral energy distribution, three color compensating filters having relatively high indices of three basic colors, respectively, arranged in such a manner that each of the filters may be selectively and individually displaced onto or away from the optical center line connecting the photosensitive material and the light source, a drive means for effecting the selective and individual displacement of the filters onto and away from the optical center line, a setting means for setting a required kind of color compensation in terms of indices and colors of two color compensating filters, a memory means for storing information concerning the optimum exposure time with the light source without a filter and properties of all the color compensating filters having the pertinent colors and indices, a computer means for determining a primary and a secondary color compensating filters out of the three color compensating filters having the relatively high indices of the three basic colors, the primary color compensating filter being required for a greater amount of color compensation than the secondary color compensating filter, as well as for computing partial exposure times, comprising a first partial exposure time during which exposure is to be made with the light source only, a second partial exposure time during which exposure is to be made with the primary color compensating filter placed over the light source, and a third partial exposure time during which exposure is to be made with the secondary color compensating filter placed over the light source in combination with the primary color compensating filter, in such manner that a color compensation which is equivalent in effect to the one which would be obtained with the combination of the two color compensating filters as set on the setting means, and a control means connected to the computer means for controlling, according to signals furnished from the computer means, functions of the drive means in such manner that the three partial exposures are conducted in a sequence of a predetermined order.

The above and other objects of the invention will become more clear from the following description of a preferred embodiment made by way of example in reference to the appended drawings.

DESCRIPTION OF THE PREFERRED EMBODIMENT

The method of the present invention, which is essentially an improvement of the aforementioned method of partial exposure times, is based on a discovery that the proper partial exposure times may be computed from the combination of the colors and the indices of color compensating filters and other easily obtainable values when a required color compensation is expressed in terms of such parameters.

For the understanding of the invention, it is important to understand the algorithm for the conversion from the partial indices to the partial exposure times, which is explained in some details in what follows.

Suppose that a color compensation defined by 25C+35Y is found to be necessary according to an observation of an original color picture through a color viewer.

Figure 1:
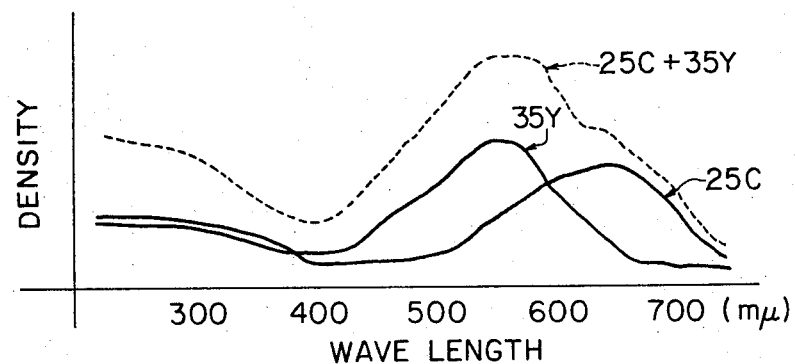
FIG. 1 is a graph showing the spectral densities of two typical color compensating filters selected according to the method of partial indices in solid lines and the spectral density of the combination of these two color compensating filters in a dotted line.

What must be determined is how an equivalent color compensation may be attained with the method of partial exposure times instead of combining the use of 25C and 35Y color compensation filters. What is required here is to obtain the same effect as that obtained by the filters expressed as 25C+35Y. The combined spectral density distribution as shown by the dotted line in FIG. 1, is derived as the sum of the spectral density distributions of the individual 25C and the 35Y filters indicated by the solid lines in FIG. 1.

If the spectral transmittance of the 25C filter is expressed as $F_{25C}(\lambda)$, the spectral transmittance of the 35Y filter as $F_{35Y}(\lambda)$, the spectral energy distribution of the light source as $f(\lambda)$, and the proper exposure time as $T_B$, then the combined spectral energy distribution of the light filtered through the color compensating filters may be expressed as;

$$E(\lambda) = f(\lambda) F_{25C}(\lambda) F_{35Y}(\lambda) T_B \quad [1]$$

If, on the assumption that an equivalent effect of exposure may be obtained only with a 50C filter, a 50Y filter and a white light (without a filter), the partial exposure time ratio for the white light only is set as A, the partial exposure time ratio by the 50Y filter only as B, and the partial exposure time ratio for the combined use of the 50Y and 50C filters as C, then;

$$E(\lambda) = f(\lambda)[A + F_{50Y}(\lambda)B + F_{50Y}(\lambda)F_{50C}(\lambda)C]T \quad [2]$$

where $A+B+C=1$ and T is the total of the partial exposure times.

It is possible to obtain approximate solutions to the above Equations [1] and [2] by equating them with respect to n arbitrary wave lengths and thereby forming a set of n-th order linear equations.

However, after some experiments, it was found that there is no need to select an infinite number of wave lengths for attaining a satisfactory result. By selecting three typical wave lengths from the visible range of light, 450 mµ, 550 mµ, and 650 mµ, for example, and forming a set of third order linear equations, partial exposure times can be determined. A color compensation exposure will be achieved that is equivalent to the one which would be obtained with the use of two color compensating filters having proper densities of two colors for the desired color compensating effect.

The above mentioned third order linear equation set may be generalized as follows;

$$\begin{aligned}
&[1 - F_1(\lambda_1)] B + [1 - F_1(\lambda_1) F_2(\lambda_1)] C + \\
&\qquad F_3(\lambda_1) F_4(\lambda_1) T_B/T = 1 \\
&[1 - F_1(\lambda_2)] B + [1 - F_1(\lambda_2) F_2(\lambda_2)] C + \\
&\qquad F_3(\lambda_2) F_4(\lambda_2) T_B/T = 1 \\
&[1 - F_1(\lambda_3)] B + [1 - F_1(\lambda_3) F_2(\lambda_3)] C + \\
&\qquad F_3(\lambda_3) F_4(\lambda_3) T_B/T = 1
\end{aligned} \quad [3]$$

where $A+B+C=1$ and $T_B = T_0/[\int F_3(\lambda) \cdot \int F_4(\lambda)]$, $T_0$ being the total exposure time when only the white light source is used for exposure.

By setting as $$D = \begin{vmatrix} a_1 & b_1 & c_1 \\ a_2 & b_2 & c_2 \\ a_3 & b_3 & c_3 \end{vmatrix} \quad D_1 = \begin{vmatrix} 1 & b_1 & c_1 \\ 1 & b_2 & c_2 \\ 1 & b_3 & c_3 \end{vmatrix}$$

$$D_2 = \begin{vmatrix} a_1 & 1 & c_1 \\ a_2 & 1 & c_2 \\ a_3 & 1 & c_3 \end{vmatrix} \quad D_3 = \begin{vmatrix} a_1 & b_1 & 1 \\ a_2 & b_2 & 1 \\ a_3 & b_3 & 1 \end{vmatrix} \quad [4]$$

where $a_1 = 1 - F_1(\lambda_1)$, $a_2 = 1 - F_1(\lambda_2)$, $a_3 = 1 - F_1(\lambda_3)$,
$b_1 = 1 - F_1(\lambda_1) F_2(\lambda_1)$, $b_2 = 1 - F_1(\lambda_2) F_2(\lambda_2)$,
$b_3 = 1 - F_1(\lambda_3) F_2(\lambda_3)$, $c_1 = F_3(\lambda_1) F_4(\lambda_1)$,
$c_2 = F_3(\lambda_2) F_4(\lambda_2)$, $c_3 = F_3(\lambda_3) F_4(\lambda_3)$, and solving equation [3], we have $$B = D_1/D, \; C = D_2/D, \; A = 1 - B - C, \text{ and } T = D \; T_B/D_3 \quad [5]$$

Therefore, $$T_1 = A\,T, \; T_2 = B\,T, \text{ and } T_3 = C\,T \quad [6]$$

In the above equations, $F_1(\lambda_i)$ and $F_2(\lambda_i)$ are spectral transmittances of either two of the 50C, 50M and 50Y color compensating filters at a wave length $\lambda_i$.

$F_3(\lambda_i)$ and $F_4(\lambda_i)$ are spectral transmittances of color compensating filters having proper colors and transmittances for attaining a desired color compensation (25C and 35Y, for example) at a wave length $\lambda_i$.

$\int F_3(\lambda)$ and $\int F_4(\lambda)$ are luminous transmittances, or filter coefficients, of the selected filters having the proper colors and indices for attaining the desired color compensation (25C and 35Y in the case of the above example)

$T_0$ is a proper exposure time without using a filter as obtained from experiments.

The above equations may be summarized as follows.

The total exposure time according to the method of partial exposure times;

$$T = D\,T_B/D_3 = D\,T_0/[D_3 \int F_3(\lambda) \int F_4(\lambda)]$$

The partial exposure time for the white light; $T_1 = A\,T$

The partial exposure time during which the primary color compensating filter, with which the highest degree of color compensation is required of 50C, 50M and 50Y, is to be used; $T_2 = B\,T$ The partial exposure time during which the secondary color compensating filter, with which a secondary amount of color compensation is required, is to be used selected from the remaining two of the 50C, 50M and 50Y; $T_3 = C\,T$ Of the parameters included in the above equations, $F_1(\lambda_i)$, $F_2(\lambda_i)$, $F_3(\lambda_i)$, $F_4(\lambda_i)$, $\int F_3(\lambda)$, and $\int F_4(\lambda)$ are known (as they are furnished from the manufacturer of the filters), and the proper exposure time $T_0$ also is known as it is determined by the intensity of the light source, the distance between the light source and the photosensitive material, and other parameters determined by the mechanical and photographic conditions. Accordingly, by substituting these values into Equations [3] through [5], each of the appropriate partial exposure times, $T_1$, $T_2$ and $T_3$, can be obtained, and the values of above mentioned D, $D_1$, $D_2$, $D_3$, T, A, B and C are all determined in the course of the computation made according to the above mentioned parameters.

By effecting partial exposures according to the partial exposure times thus obtained, a color compensation which is equivalent in effect to the color compensation exposure using a combination of filters having the spectral transmittances $F_3(\lambda)$ and $F_4(\lambda)$ (25C and 35Y, for example) during the time period $T_B$ can be achieved.

Figure 2:
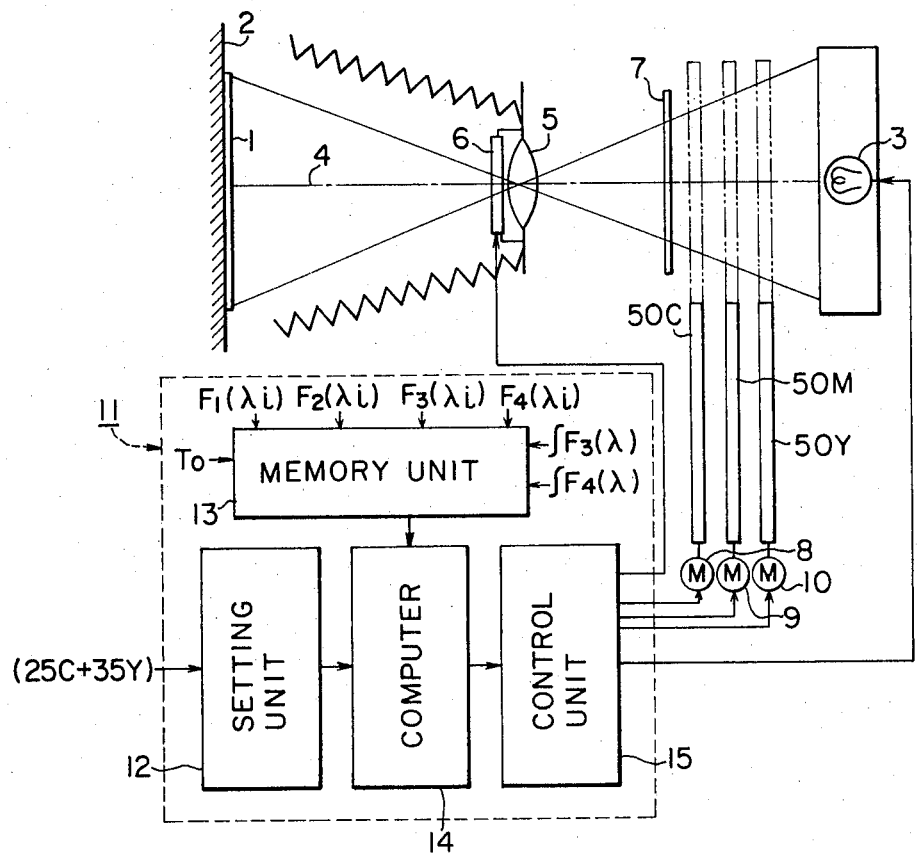
FIG. 2 is a simplified diagram showing the structure of the preferred embodiment of the apparatus according to the invention.

In what follows, the apparatus according to the present invention is described in reference to an exemplary embodiment in FIG. 2. The method of the present invention also will become more clear from the following description.

In FIG. 2, 1 indicates a photosensitive material such as a color duplicating film mounted in a film holder 2 whereas 3 indicates a white light source (hereinafter referred to merely as the light source) aligned on an optical center line 4.

On the optical center line 4 between the photosensitive material 1 and the light source 3 are mounted a lens 5 and a shutter 6 close to one another. On the other hand, on the optical center line 4 between the lens 5 and the light source 3 is mounted an original color picture 7, in this embodiment a transparency.

Color compensating filters having the highest degree of densities of cyan (50C), magenta (50M) and yellow (50Y) are mounted to be placed on the optical center line 4 between the original color picture 7 and the light source 3 in such a maner that the filters may be individually moved onto (as shown in broken lines in FIG. 2) or away from (as shown in solid lines in FIG. 2) the optical center line 4 through the actuation of a drive means consisting of motors M 8, 9 and 10 connected respectively to the corresponding filters.

The connection betwen the filters and the motors 8, 9 and 10, which is only diagrammatically shown in FIG. 2, may be made by any conventional power transmitting means such as a mechanism in which each of the motors is a reversible motor provided with a threaded shaft (not shown in the drawing) on its drive shaft and each of the filters 50C, 50M and 50Y is vertically displaced with the driving action of the threaded rod or, alternatively, a mechanism in which a pinion gear (not shown in the drawing) is fixed on the shaft of each of the motors 8, 9 and 10 and the filters are vertically driven as each filter is attached with a rack (not shown in the drawing) which meshes with one of the pinion gears.

It also is possible to use other drive means, instead of motors 8, 9 and 10, such as solenoids for driving the filters 50C, 50M and 50Y onto or away from the optical center line 4.

An electronic control device 11 controls the timing of opening and closing of the shutter 6, the lighting of the light source 3, and the actuation of the motors 8, 9 and 10 and generally comprises a color compensation setting unit (hereinafter referred to merely as setting unit) 12, a memory unit 13, a computer unit 14 and a control unit 15.

The setting unit 12 is for setting a required kind of color comensation in terms of a combination of indices of two colors out of cyan, magenta and yellow such as 25C+35Y, for example, and the setting is transmitted to the computer unit 14 as an electric signal. If only one color is needed to be compensated, then the setting will be expressed as 25C+0, for example.

The memory unit 13 contains the information concerning the properties of color compensating filters having the indices ranging from 0 to 50 in multiples of 5 for each of the three basic colors, cyan, magenta and yellow (including the 50C, 50M and 50Y filters) as well as the information concerning $F_1(\lambda_i)$, $F_2(\lambda_i)$, $F_3(\lambda_i)$, $F_4(\lambda_i)$, $\int F_3(\lambda)$ and $\int F_4(\lambda)$ in the above mentioned computations and the optimum exposure time $T_0$ with the light source 3 without any filter placed thereover.

The computer unit 14 is connected to both the setting unit 12 and the memory unit 13, and determines which filters are to be used (50C and 50Y filters, for example) based upon the setting (25C+35Y, for example) as set by the setting unit 12 as well as which one of the filters is to be the primary filter with which a greater amount of color compensation is required. Subsequently, the computer unit 14 further performs the above described computations according to the information concerning the filters (25C, 35Y, 50C and 50Y, in the case of the above example), i.e. $F_1(\lambda_i)$, $F_2(\lambda_i)$, $F_3(\lambda_i)$, $F_4(\lambda_i)$, $\int F_3(\lambda)$ and $\int F_4(\lambda)$, and in addition, the optimum exposure time $T_0$ supplied from the memory unit 13 and the setting unit 12, and finds the partial exposure times $T_1$, $T_2$ and $T_3$ in the form of electric output signals.

The control unit 15 is connected to the output terminal of the computer unit 14 as well as to each of the actuating parts, i.e. the shutter 6, the motors 8, 9 and 10, and the light source 3, and automatically controls the opening period of the shutter 6, the displacement of the filters 50C, 50M and 50Y through the motors 8, 9 and 10, and the lighting period of the light source 3 according to the electric signals from the computer unit 14.

To be specific, the control unit 15 is provided with a timer (not shown in the drawing) which is actuated in response to the output signal from the computer unit 14. The timer is programmed in such a manner that each of the partial exposures is conducted in a sequential manner. First of all, the light source 3 is put on (at this moment, the filters 50C, 50M and 50Y are displaced away from the optical center line 4), the shutter 6 is actuated and opened up. After the termination of the first partial exposure time $T_1$, the primary color compensation filter (the filter 50Y in the above example) is swiftly moved onto the optical center line 4 by driving the corresponding motor (the motor 10 in the case of the above example) in its normal direction. Then, after the termination of the second partial exposure time $T_2$, the secondary color compensating filter (50C in the case of the above example) is swiftly moved onto the optical center line 4, in addition to the primary color compensating filter which is already placed on the optical center line 4, by driving the corresponding motor (the motor 8 in the case of the above example) in its normal direction. Lastly, upon the termination of the third partial exposure time $T_3$, the shutter 6 is closed and the two color compensating filters on the optical center line 4 are restored to their original positions which are indicated by the solid lines in FIG. 2. If there are other succeeding exposures to be made for duplicating other pictures, the above described steps may be repeated for each of the color compensation exposures. Otherwise, the light source is put out and the action of the timer is terminated.

Therefore, with the apparatus of the invention, the desired partial exposure times $T_1$, $T_2$ and $T_3$ are automatically computed merely by setting the desired amount of color compensation on the setting unit 12 in terms of indices of two color compensation filters for two colors selected out of basic three colors in a conventional manner and, in accordance with the partial exposure times thus computed, the first partial exposure with the white light source 3 alone, the second partial exposure with the primary color compensating filter placed over the white light source, and the third partial exposure with the secondary color compensating filter placed over the primary color compensating filter are made for the periods of the corresponding partial exposure times $T_1$, $T_2$ and $T_3$, respectively, in an automatic and sequential manner.

It also is possible to temporarily close the shutter 6 after each termination of the partial exposure times during the above described sequential action in order to suspend each exposure while a color compensating filter is being moved onto and away from the optical center. By doing so, the accuracy in each exposure may be increased and a more satisfactory result may be obtained at the expense of slightly increased overall time of color compensating exposures and additional arrangement in the timer incorporated in the control unit 15.

As may be readily understood from the above description, according to this invention, anybody even without much experience may perform color compensating exposure very accurately since the actual exposures are conducted by the method of partial exposures while the required amount of color compensation is given in terms of indices of two color compensation filters selected out of the three basic colors in a conventional and well established manner.

In other words, the present invention combines the advantages of the most basic method of color compensation exposure, or the method of partial indices, which is widely known, concerning the facility in determining the required amount of color compensation, and the method of partial exposures, concerning the simplicity in requiring only a small number of color compensating filters and the adaptability to be automated, while the shortcomings of these two methods are eliminated.

The method and the apparatus of this invention are particularly suitable for so-called composite duplicating cameras in which a plurality of original color picture images are exposed on a sheet of color film according to a specified plan. Because, when using such duplicating cameras, the required amount and natures of color compensation for each of the original color picture images are generally different from one original picture to another and not only the work involved in color compensation exposure is great in amount but also no error in color compensating exposure is allowed since a single unfavorable color compensation in any one of the indivisual color picture laid out on the finished color film will ruin the whole composite color film picture.

When applying this invention to such cameras, the convenience provided by the invention will be further enhanced if the information concerning the required amount of color compensation is stored in perforated paper tape in advance and the setting unit is adapted to read such information from the paper tape.

In the foregoing description of an embodiment, the case was limited to the ones where two colors are required to be compensated. However, there are some cases where only one color is needed to be compensated. In such cases, the required color compensation may be expressed in such forms as $25C+0$, $15M+0$, etc..

In such cases where only one color is needed to be compensated, the third order linear equations in Equation [3] will degenerate into a set of second order linear equations and the optimum partial exposures will be found only for the first partial exposure time ($T_1$) during which only the white light is used for exposure and the second partial exposure time ($T_2$) during which the primary color compensating filter, having the color which is needed to be compensated, is used over the white light (i.e. $T_3=0$).

In a similar way, there are cases where no color compensation is required. In such cases, the total exposure time T is equal to the optimum exposure time with only the white light $T_0$ as well as to the first partial exposure time $T_1$. And, $T_2$ and $T_3$ are zeros as a matter of course.

As the last special case, there may be a time when only one color is needed to be compensated to such an degree that the desired color compensation is best made by performing exposure only with the use of a color compensating filter (i.e. $T_1=T_3=0$).

Although the invention has been shown and described with reference to a preferred embodiments thereof, it should be understood that various changes and modifications of the form and the content thereof may be made therein without departing from the spirit of the invention. For example, the algorithm for converting the partial indices into the partial exposure times may not necessarily be the one shown in detail in the body of this specification but also there may be others which are based on the known techniques of optimization. Even when the mentioned algorithm is used, the selection of the typical wave lengths is not restricted to the one made by way of example in the description of this specification. It will also be readily apparent that the present method and apparatus can easily be adapted to provide color correction for prints, as well. One need only re-align the source and filters to project light upon the print and position the lens and shutter to receive the reflected light.

Therefore, it will be understood that the invention and its scope are not limited by any details of the embodiment shown and described, or of the drawings, which were all given for the purpose of illustration only, but solely by the appended claims.

We claim:

1. A method for color compensation exposure for use in taking photographic pictures in a color duplication process, wherein according to the principle of partial exposure intervals, the exposure is first made with white light followed by exposures using a first maximum index color compensation filter of a color for which the highest level of color compensation is required and then using a second maximum index color compensation filter of another color for which additional color compensation is required so as to obtain the substantially same effect as by fixed color compensation filters selected from a number of color compensating filters with varying densities, the process comprising the steps of;

making a first partial exposure with white light, for a first time interval ($T_1$);

making a second partial exposure with the first color compensating filter for a second time interval ($T_2$); and making a third partial exposure with the second color compensation filter in combination with the first color compensating filter, for a third time interval ($T_3$);

said intervals being determined by designating the indices of the fixed filters which would produce the desired effect of color compensation and carrying out an algorithm which yields the three time intervals ($T_1$, $T_2$ and $T_3$) required for producing the optimum approximation at a plurality of wavelengths.

2. A method according to claim 1, wherein the algorithm comprises the steps of equating the total exposures at three wavelengths of those which would be produced by partial exposures over the three unknown time intervals ($T_1$, $T_2$ and $T_3$) and those which would be produced by normal exposure with a known combination of the fixed filters of designated index, forming the proceding relation as a set of third order linear equations and solving it for the partial time intervals ($T_1$, $T_2$ and $T_3$).

3. A method according to claims 1 or 2, wherein the three basic colors are cyan, magenta and yellow.

* * * * *